United States Patent
Tamaki

(10) Patent No.: US 12,354,878 B2
(45) Date of Patent: Jul. 8, 2025

(54) SEMICONDUCTOR DEVICE HAVING SEMICONDUCTOR SUBSTRATE INCLUDING HYDROGEN-RELATED DONOR, AND MANUFACTURING METHOD THEREFOR

(71) Applicant: Mitsubishi Electric Corporation, Tokyo (JP)

(72) Inventor: Tomohiro Tamaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 97 days.

(21) Appl. No.: 17/797,109

(22) PCT Filed: Mar. 13, 2020

(86) PCT No.: PCT/JP2020/010983
§ 371 (c)(1),
(2) Date: Aug. 3, 2022

(87) PCT Pub. No.: WO2021/181644
PCT Pub. Date: Sep. 16, 2021

(65) Prior Publication Data
US 2023/0111002 A1    Apr. 13, 2023

(51) Int. Cl.
*H10D 62/53*   (2025.01)
*H01L 21/30*   (2006.01)
(Continued)

(52) U.S. Cl.
CPC ......... *H01L 21/3003* (2013.01); *H10D 62/53* (2025.01); *H10D 12/441* (2025.01); *H10D 30/66* (2025.01)

(58) Field of Classification Search
CPC . H01L 29/32; H01L 29/7395; H01L 29/7802; H01L 29/0634; H01L 29/083;
(Continued)

(56) References Cited

U.S. PATENT DOCUMENTS

| 2002/0031889 A1 | 3/2002 | Nishihara et al. |
| 2008/0246096 A1 | 10/2008 | Sakakibara et al. |

(Continued)

FOREIGN PATENT DOCUMENTS

| CN | 104903997 A | 9/2015 |
| JP | 2001-326366 A | 11/2001 |

(Continued)

OTHER PUBLICATIONS

International Search Report and Written Opinion mailed on Jun. 2, 2020, received for PCT Application PCT/JP2020/010983, filed on Mar. 13, 2020, 15 pages including English Translation.

(Continued)

*Primary Examiner* — Shahed Ahmed
(74) *Attorney, Agent, or Firm* — XSENSUS LLP

(57) ABSTRACT

A semiconductor device is formed using a semiconductor substrate having a first main surface and a second main surface. A first semiconductor region of a first conductivity type is formed between the first main surface and the second main surface of the semiconductor substrate. A second semiconductor region is formed between the first semiconductor region and the first main surface. The first semiconductor region includes a hydrogen-related donor, and a concentration of the hydrogen-related donor of the first semiconductor region is equal to or larger than an impurity concentration of the first semiconductor region.

3 Claims, 12 Drawing Sheets

(51) Int. Cl.
*H10D 12/00* (2025.01)
*H10D 30/66* (2025.01)

(58) Field of Classification Search
CPC . H01L 29/0878; H01L 29/167; H01L 29/861; H01L 2924/12031; H01L 29/868; H01L 29/6603; H01L 29/6606; H01L 21/3003–3006; H01L 29/36–365; H01L 21/046–047; H10D 62/53; H10D 12/441; H10D 30/66; H10D 8/00; H10D 8/045; H10D 12/032; H10D 30/0291; H10D 62/129; H10D 62/145; H10D 62/157; H10D 62/834; H10D 8/50; H10D 62/60–605
See application file for complete search history.

(56) References Cited

U.S. PATENT DOCUMENTS

| | | | |
|---|---|---|---|
| 2014/0124897 | A1 | 5/2014 | Motoyama et al. |
| 2014/0246755 | A1* | 9/2014 | Yoshimura ............ H01L 29/861 257/617 |
| 2015/0311279 | A1 | 10/2015 | Onozawa et al. |
| 2017/0271447 | A1* | 9/2017 | Tamura ............... H01L 21/2253 |
| 2018/0097064 | A1 | 4/2018 | Caspary et al. |
| 2020/0395215 | A1* | 12/2020 | Kubouchi ........... H01L 29/0611 |

FOREIGN PATENT DOCUMENTS

| | | |
|---|---|---|
| JP | 2007266233 A | 10/2007 |
| JP | 2008-258313 A | 10/2008 |
| JP | 5228282 B2 | 7/2013 |
| JP | 2014-93504 A | 5/2014 |
| WO | 2013/100155 A1 | 7/2013 |
| WO | 2014/208404 A1 | 12/2014 |
| WO | 2016/204227 A1 | 12/2016 |

OTHER PUBLICATIONS

The First Office Action mailed Mar. 24, 2025, in Chinese Application No. 202080098195.1, 20 pages including English translation.

* cited by examiner

F I G. 9
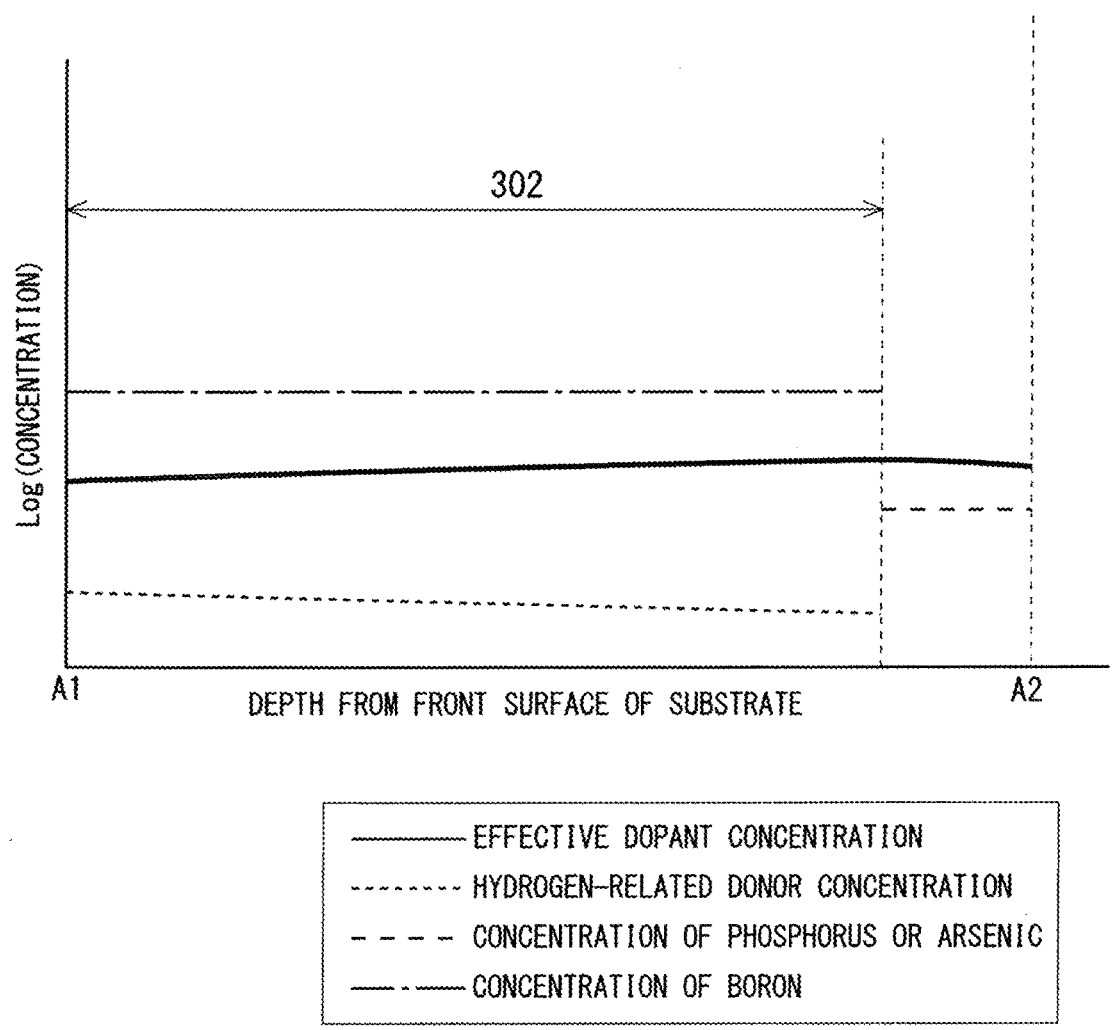

SEMICONDUCTOR DEVICE HAVING SEMICONDUCTOR SUBSTRATE INCLUDING HYDROGEN-RELATED DONOR, AND MANUFACTURING METHOD THEREFOR

CROSS-REFERENCE TO RELATED APPLICATION

The present application is based on PCT filing PCT/JP2020/010983, filed Mar. 13, 2020, the entire contents of which is incorporated herein by reference.

TECHNICAL FIELD

The present disclosure relates to a semiconductor device and a method of manufacturing the semiconductor device.

BACKGROUND ART

A floating zone (FZ) substrate formed with crystal growth by an FZ method is generally used for an n-type drift layer of a power semiconductor device (power device) such as an insulated gate bipolar transistor (IGBT) made of silicon (Si) as a semiconductor material, for example. The FZ substrate is doped with phosphorus as an n-type dopant at a time of crystal growth. When a specific resistance of the FZ substrate is too small, a problem of reduction in withstand voltage occurs, and when it is too large, a problem of reduction in breakdown resistance or oscillation such as ringing occurs. In order to prevent the occurrence of such problems, it is effective to suppress fluctuation of a specific resistance of an n-type drift layer, and it is preferable to keep a tolerance of the specific resistance within approximately ±10%.

However, when a power device made of silicon is manufactured with a substrate (wafer) with 300 mm diameters, only a magnetic field applied Czochralski (MCZ) substrate manufactured by MCZ method can be obtained. In the MCZ method, a concentration of phosphorus taken in a silicon crystal increases as an ingot as a material of the wafer grows in accordance with a segregation effect of phosphorus in a molten silicon. Thus, a specific resistance in the MCZ ingot fluctuates in a growth direction of ingot, and it is difficult to keep a specific resistance tolerance in the ingot within ±10%. As a result, fluctuation of the specific resistance occurs in the MCZ substrate cut from the MCZ ingot.

Thus, attempted is improvement of the fluctuation of the specific resistance by counter-doping boron in a crystal of the MCZ ingot, however, the specific resistance tolerance of approximately 22% of the MCZ ingot is not kept within ±10% even when this method is used (for example, Patent Document 1).

Strict management of the specific resistance tolerance of the MCZ ingot significantly reduces cost efficiency, thus a specific resistance of the substrate is preferably uniformized in a step of manufacturing a semiconductor device. However, a process of a conventional technique is complex, and it is difficult to uniformize the specific resistance of the substrate in a short time (for example, Patent Document 2).

PRIOR ART DOCUMENTS

Patent Documents

Patent Document 1: US Patent Application Publication No. 2018/0097064
Patent Document 2: Japanese Patent No. 5228282

SUMMARY

Problem to be Solved by the Invention

Patent Document 2 discloses a technique of uniformly converting a substrate into a donor by irradiating (implanting) proton to (into) the substrate several times while displacing a range peak position of proton by a distance obtained by dividing a half width of a distribution of range of proton by an integral number. However, proton needs to be irradiated several times with high energy of 10 MeV or more using an extensive cyclotron device to uniformly convert a whole region of the drift layer as a withstand voltage retention layer into a donor. This technique can be performed by an ion implantation device with implantation energy of approximately 2 MeV, for example, however, in such a case, a half width of a distribution of range of proton in silicon is small, that is 10 μm or less, thus a considerable number of irradiations of proton is necessary, and a manufacturing cost increases.

The present disclosure is therefore has been made to solve such a problem, and it is an object to provide a semiconductor device capable of obtain a uniform specific resistance of an n-type drift layer by a simple process in a step of manufacturing the semiconductor device and method of manufacturing the semiconductor device.

Means to Solve the Problem

A semiconductor device according to the present disclosure includes: a semiconductor substrate having a first main surface and a second main surface; a first semiconductor region of a first conductivity type formed between the first main surface and the second main surface of the semiconductor substrate; and a second semiconductor region of a second conductivity type formed between the first semiconductor region and the first main surface, wherein the first semiconductor region includes a hydrogen-related donor, and a concentration of the hydrogen-related donor of the first semiconductor region is equal to or higher than an impurity concentration of the first semiconductor region.

Effects of the Invention

The semiconductor device according to the present disclosure can cover a shortage of donor with the hydrogen-related donor by a simply process of passing a light ion or an electron beam through the semiconductor substrate in the step of manufacturing the semiconductor device to perform hydrogen plasma processing and annealing, and a uniform specific resistance of the first semiconductor region as the n-type drift layer can be obtained.

These and other objects, features, aspects and advantages of the present disclosure will become more apparent from the following detailed description when taken in conjunction with the accompanying drawings.

BRIEF DESCRIPTION OF DRAWINGS

FIG. 9 A diagram illustrating a dopant concentration profile in a depth direction of a portion of a p-pillar layer in the semiconductor substrate according to the embodiment 3.

DESCRIPTION OF EMBODIMENT(S)

Embodiment 1

Figure 1:
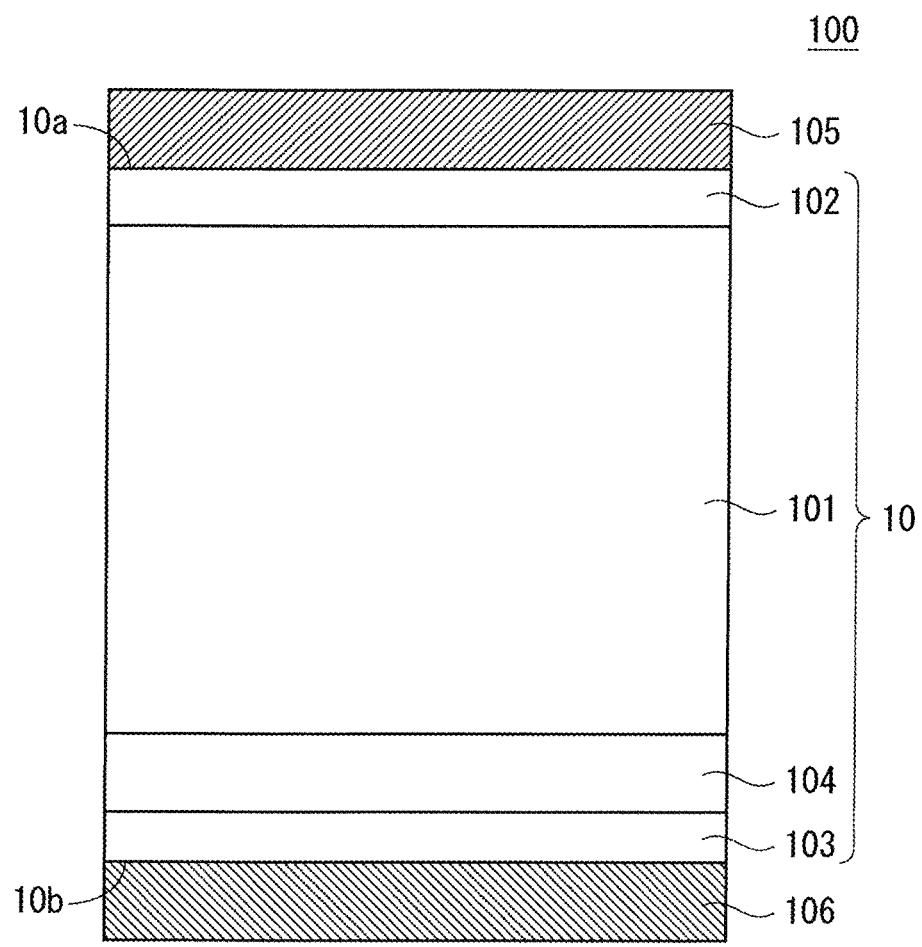
FIG. 1 A cross-sectional view of a semiconductor device (PiN diode) according to an embodiment 1.

FIG. 1 is a cross-sectional view illustrating a configuration of a PiN diode 100 as a semiconductor device according to an embodiment 1. For simplification, FIG. 1 illustrates only a structure of an active region operating as a diode, and illustration of a terminal structure provided in a peripheral region on an outer side of the active region is omitted.

A PiN diode 100 according to the embodiment 1 is formed using a semiconductor substrate 10 as a silicon substrate (MCZ substrate) formed by MCZ method. However, a type of the semiconductor substrate 10 is not limited thereto, but a silicon substrate (FZ (floating zone) substrate) formed by FZ method or a Czochralski (CZ) epitaxial substrate formed by providing an epitaxial growth layer on the silicon substrate formed by CZ method may also be applicable, for example. A member having characteristics appropriate for a semiconductor device to be manufactured may be appropriately selected as a type of the semiconductor substrate 10.

Herein, a main surface of a front side (an upper side in FIG. 1) of the semiconductor substrate 10 is defined as a first main surface 10a, and a main surface of a back side (a lower side in FIG. 1) thereof is defined as a second main surface 10b. In the description hereinafter, a first conductivity type is an n type and a second conductivity type is a p type.

As illustrated in FIG. 1, an n-type drift layer 101 (first semiconductor region) of a first conductivity type is formed between the first main surface 10a and the second main surface 10b of the semiconductor substrate 10. A p-type anode layer 102 (second semiconductor region) of a second conductivity type is formed in a surface portion of the semiconductor substrate 10 on a side of the first main surface 10a, that is to say, between the n-type drift layer 101 and the first main surface 10a. An n-type cathode layer 103 (third semiconductor region) of a first conductivity type having a higher peak concentration of impurity than the n-type drift layer 101 is formed in a surface portion of the semiconductor substrate 10 on a side of the second main surface 10b, that is to say, between the n-type drift layer 101 and the second main surface 10b. An n-type buffer layer 104 of a first conductivity type having a higher peak concentration of impurity than the n-type drift layer 101 and having a lower peak concentration of impurity than the n-type cathode layer 103 is formed between the n-type drift layer 101 and the n-type cathode layer 103.

An anode electrode 105 connected to the p-type anode layer 102 is formed on the first main surface 10a of the semiconductor substrate 10. A cathode electrode 106 connected to the n-type cathode layer 103 is formed on the second main surface 10b of the semiconductor substrate 10.

Figure 2:
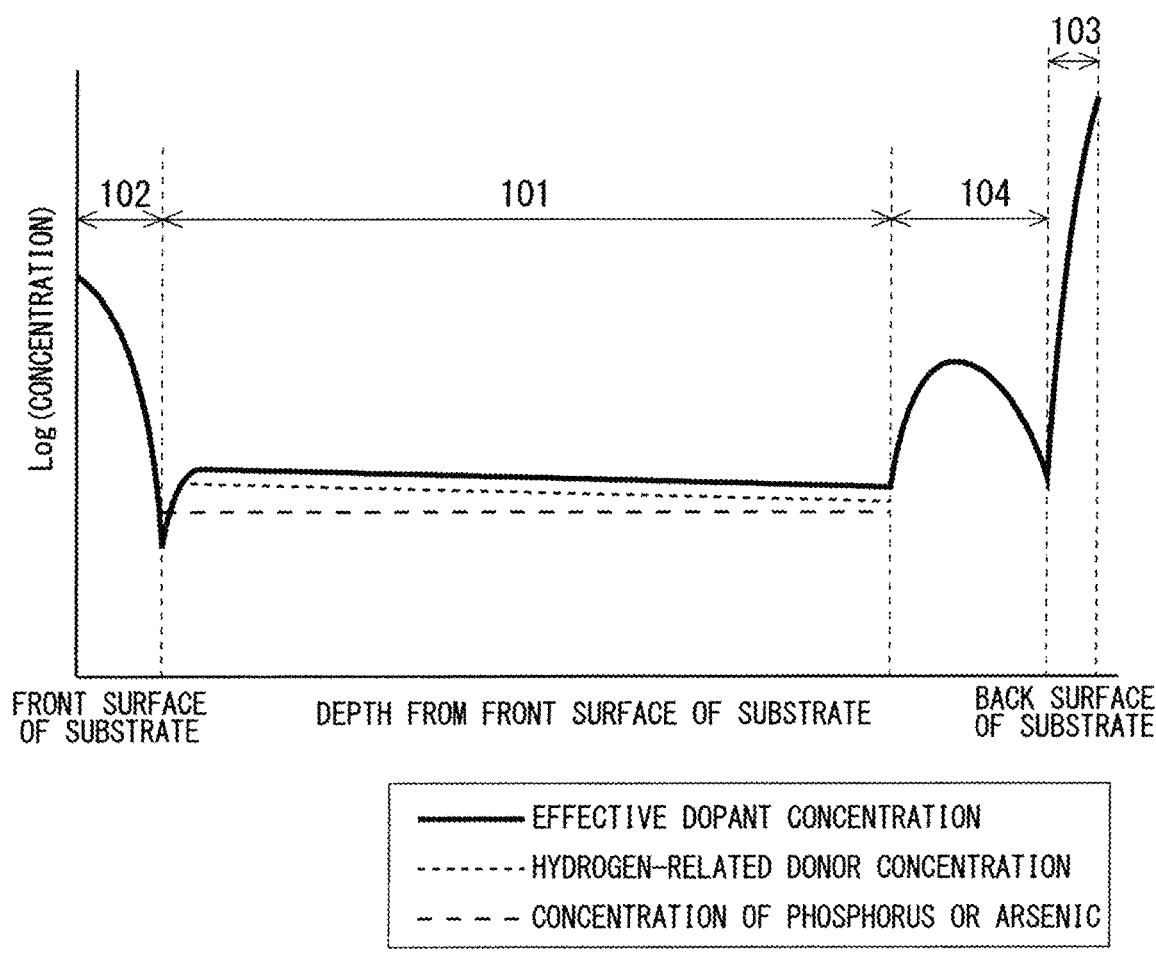
FIG. 2 A diagram illustrating a dopant concentration profile in a depth direction of the semiconductor device according to the embodiment 1.

FIG. 2 is a diagram illustrating a dopant concentration profile in a depth direction of the PiN diode 100, and illustrates a dopant concentration profile in a depth direction of the p-type anode layer 102, the n-type drift layer 101, the n-type buffer layer 104, and the n-type cathode layer 103. As illustrated in FIG. 2, the n-type drift layer 101 includes a hydrogen-related donor over a whole region from an end portion on a side of the first main surface 10a thereof (side of a front surface of the substrate) to an end portion on a side of the second main surface 10b thereof (side of a bottom surface of the substrate). In the n-type drift layer 101, a hydrogen-related donor concentration is always equal to or higher than an impurity concentration (a concentration of phosphorus or arsenic) of the n-type drift layer 101 over a whole region from an end portion on a side of the first main surface 10a thereof to an end portion on a side of the second main surface 10b thereof, and continuously increases from the second main surface 10b toward the first main surface 10a. That is to say, the hydrogen-related donor concentration of the n-type drift layer 101 is highest in the end portion of the n-type drift layer 101 on the side of the first main surface 10a and lowest in the end portion of the n-type drift layer 101 on the side of the second main surface 10b.

Figure 3:
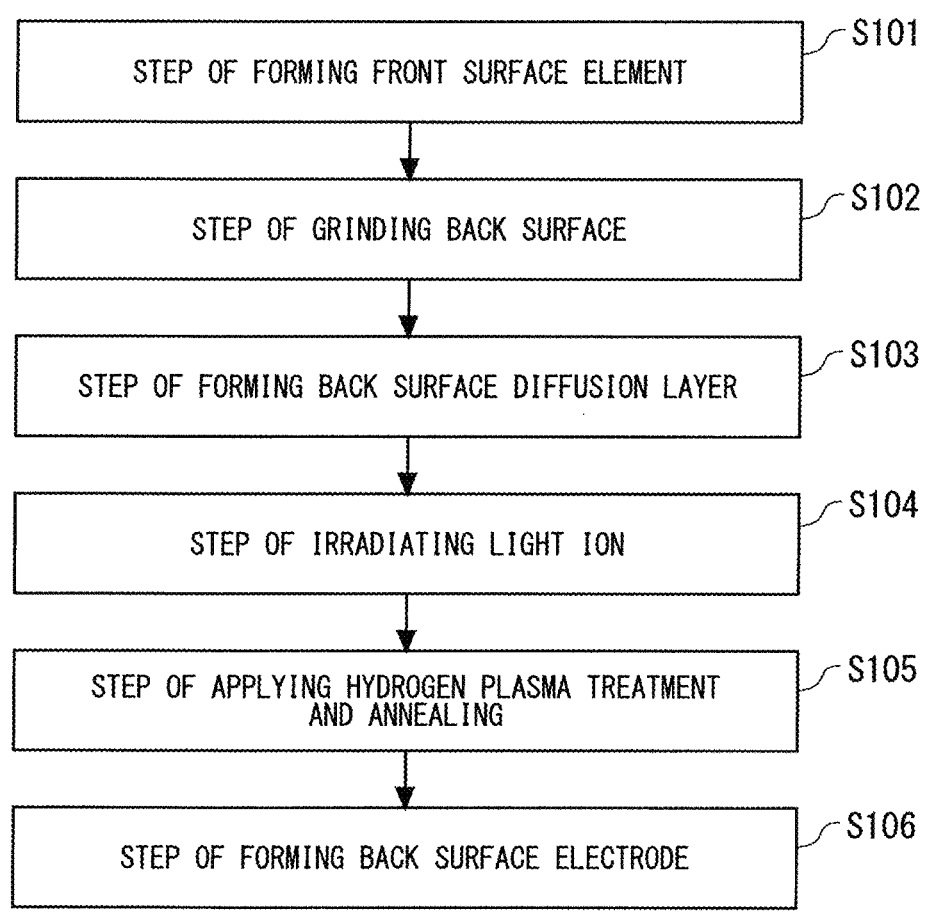
FIG. 3 A flow chart illustrating a process of manufacturing of the semiconductor device according to the embodiment 1.

FIG. 3 is a flow chart illustrating a method of manufacturing the PiN diode 100 according to the embodiment 1. The method of manufacturing the PiN diode 100 is described hereinafter with reference to FIG. 3.

In a step of forming a front surface element (Step S101), prepared firstly is a wafer of the semiconductor substrate 10 made of n-type silicon doped with phosphorus. At this time, a phosphorus concentration in the semiconductor substrate 10 is lower than a phosphorus concentration for obtaining desired withstand voltage in a completed semiconductor device, thus the semiconductor substrate 10 is in a state of high specific resistance. N-type impurity with which the semiconductor substrate 10 is doped may be arsenic. Then, an element structure of the PiN diode 100 is formed on the side of the first main surface 10a of the semiconductor substrate 10. That is to say, the p-type anode layer 102 is formed on a surface portion of the semiconductor substrate 10 on the side of the first main surface 10a, and furthermore, the anode electrode 105 connected to the p-type anode layer 102 is formed on the first main surface 10a.

In a step of grinding a back surface (Step S102), the second main surface 10b of the semiconductor substrate 10 is ground so that the semiconductor substrate 10 has a desired thickness necessary for retaining withstand voltage. At this time, processing of removing a fracture layer may be performed by chemical etching grinding.

In a step of forming a back surface diffusion layer (Step S103), firstly, phosphorus is implanted into the second main surface 10b of the semiconductor substrate 10, thus the n-type buffer layer 104 is formed on the surface portion of the semiconductor substrate 10 on the side of the second main surface 10b. The n-type cathode layer 103 having a higher peak concentration of impurity than the n-type buffer layer 104 is formed in a position smaller in depth than the n-type buffer layer 104 in the surface portion of the semiconductor substrate 10 on the side of the second main surface 10b. At this time, a p-type cathode layer of the second conductivity type may be selectively formed on a part of the surface portion of the n-type cathode layer 103.

An n-type region of the semiconductor substrate 10 where the p-type anode layer 102, the n-type cathode layer 103, and the n-type buffer layer 104 are not formed but the n-type region thereof is left in Step S101 and Step S103 serves as the n-type drift layer 101.

Figure 4:
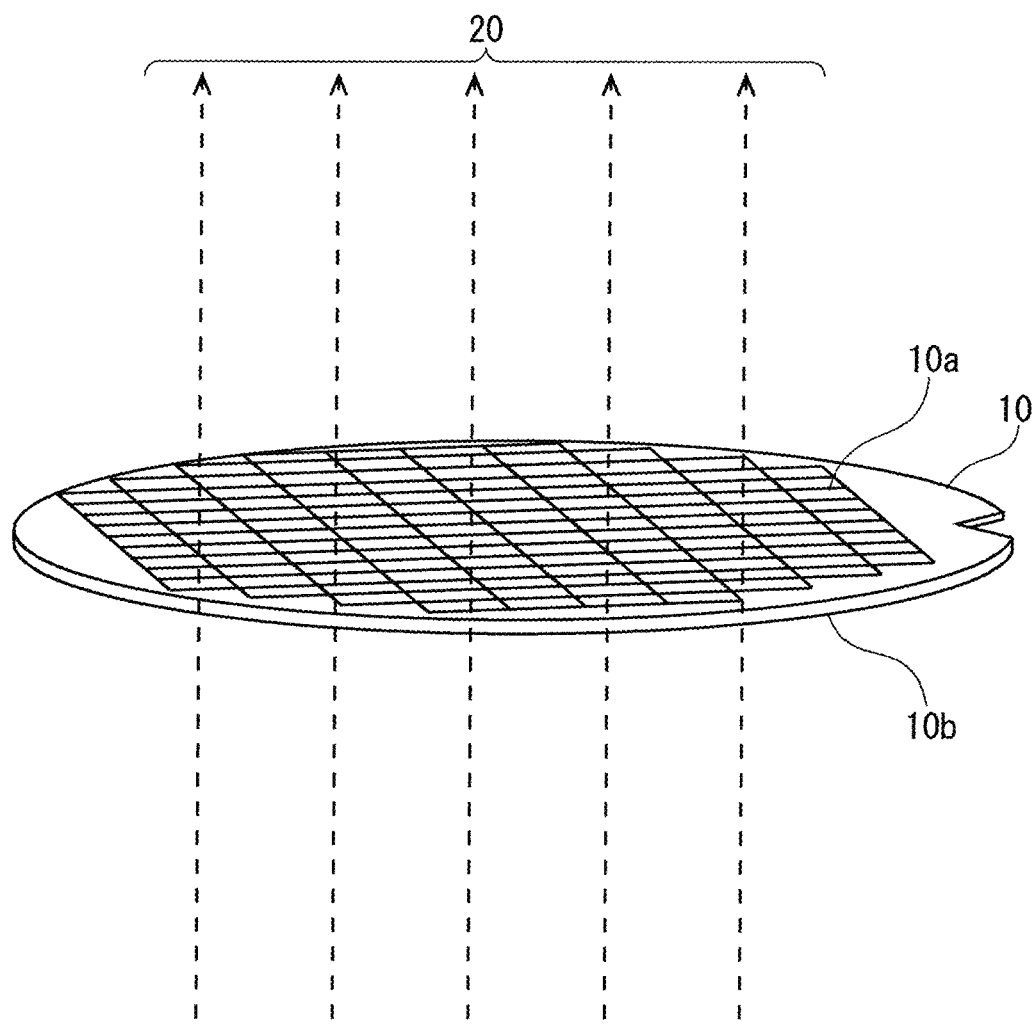
FIG. 4 A schematic diagram of a light ion irradiation on a semiconductor substrate.

In a step of irradiating a light ion (Step S104), as illustrated in FIG. 4, a light ion 20 such as helium (He) is irradiated to pass through the semiconductor substrate 10 from the side of the second main surface 10b of the semiconductor substrate 10 with acceleration energy of 1 MeV or more to generate a damage on a whole region of silicon of the semiconductor substrate 10. Accordingly, the semiconductor substrate 10 has a configuration that interstitial silicon ($Si_i$) deviating from a lattice location and a vacancy (V) located in the lattice location, for example, are generated in a region where silicon is damaged. It is sufficient that the light ion is helium (He), hydrogen (H), or an isotope thereof, and a dose amount of the light ion irradiation is equal to or larger than $1\times10^{14}$ $cm^{-2}$ and equal to or smaller than $1\times10^{16}$ $cm^{-2}$.

In a step of applying hydrogen plasma treatment and annealing (Step S105), firstly, hydrogen plasma is irradiated from the side of the second main surface 10b of the semiconductor substrate 10 to introduce hydrogen (H) into the region where silicon is damaged. Then, annealing is performed at a temperature of 300° C. to 450° C. in a state where hydrogen is introduced into the damaged region. Accordingly, the vacancy reacts with oxygen (O) included in a wafer to form VO defect, and the VO defect reacts with hydrogen introduced by the hydrogen plasma irradiation to form VOH defect. The VOH defect makes an electron trap level in a position around 0.35 eV from a conductive band, and contributes to formation of hydrogen-related donor. As a result, the hydrogen-related donor is formed in a whole region in the semiconductor substrate 10, and a dopant concentration profile illustrated in FIG. 2 is obtained.

In a step of forming a back surface electrode (Step S106), the cathode electrode 106 is formed as a back surface electrode necessary for a package sealing on the second main surface 10b of the semiconductor substrate 10.

According to the above steps, a device wafer in which the PiN diode 100 having a configuration illustrated in FIG. 1 is formed is completed.

In this manner, according to the embodiment 1, a shortage of donor in the semiconductor substrate 10 is covered with the hydrogen-related donor by a simply process of passing the light ion through the wafer of the semiconductor substrate 10 having the high specific resistance in the step of manufacturing the power device to perform hydrogen plasma processing and annealing, thus a uniform specific resistance of the n-type drift layer can be obtained. That is to say, the specific resistance of the wafer can be uniformized in the step of manufacturing the device.

Embodiment 2

Figure 5:
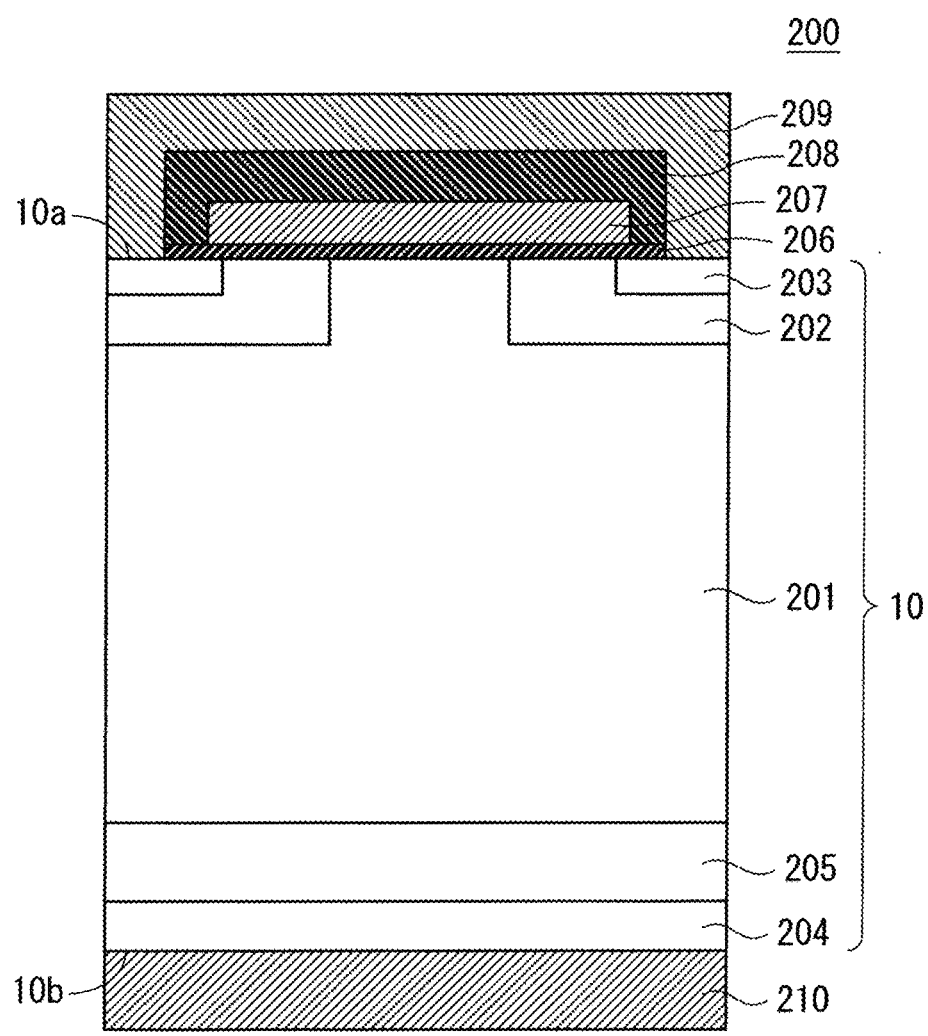
FIG. 5 A cross-sectional view of a semiconductor device (IGBT) according to an embodiment 2.

Described in an embodiment 2 is an example that a semiconductor device formed using the semiconductor substrate 10 is a metal oxide semiconductor (MOS) device. FIG. 5 is a cross-sectional view illustrating a configuration of an IGBT 200 as a semiconductor device according to the embodiment 2. For simplification, FIG. 5 illustrates only a structure of a unit cell of the IGBT, and illustration of a terminal structure provided in a peripheral region is omitted.

In the embodiment 2, the semiconductor substrate 10 in which the IGBT 200 is formed is the MCZ substrate. However, a type of the semiconductor substrate 10 is not limited thereto, but an FZ substrate or a CZ epitaxial substrate, for example, is also applicable.

As illustrated in FIG. 5, an n-type drift layer 201 (first semiconductor region) of a first conductivity type is formed between the first main surface 10a and the second main surface 10b of the semiconductor substrate 10. A p-type base layer 202 (second semiconductor region) of a second conductivity type is selectively formed in the surface portion of the semiconductor substrate 10 on the side of the first main surface 10a, that is to say, a part of a region between the n-type drift layer 201 and the first main surface 10a. An n-type emitter layer 203 of a first conductivity type is formed in a part of a region in the surface portion of the p-type base layer 202.

A p-type collector layer 204 (fourth semiconductor region) of a second conductivity type having a higher peak concentration of impurity than the n-type drift layer 201 is formed in the surface portion of the semiconductor substrate 10 on the side of the second main surface 10b, that is to say, between the n-type drift layer 201 and the second main surface 10b. An n-type buffer layer 205 of a first conductivity type having a higher peak concentration of impurity than the n-type drift layer 201 and having a lower peak concentration of impurity than the p-type collector layer 204 is formed between the n-type drift layer 201 and the p-type collector layer 204.

A gate insulating film 206 is formed on the first main surface 10a of the semiconductor substrate 10 to extend over the n-type drift layer 201, the p-type base layer 202, and the n-type emitter layer 203, and a gate electrode 207 is formed thereon. The gate electrode 207 is disposed to face the n-type drift layer 201, the p-type base layer 202, and the n-type emitter layer 203 via the gate insulating film 206. An interlayer insulating film 208 is formed on the gate electrode 207, and an emitter electrode 209 is formed on the interlayer insulating film 208. A contact hole reaching the n-type emitter layer 203 is formed in the interlayer insulating film 208, and the emitter electrode 209 is connected to the n-type emitter layer 203 through the contact hole.

A collector electrode 210 connected to the p-type collector layer 204 is formed on the second main surface 10b of the semiconductor substrate 10.

The n-type drift layer 201 includes a hydrogen-related donor over a whole region thereof. In the n-type drift layer 201, a hydrogen-related donor concentration is always equal to or higher than an impurity concentration (a concentration of phosphorus or arsenic) of the n-type drift layer 201 from the side of the first main surface 10a to the side of the second main surface 10b in the semiconductor substrate 10, and continuously increases from the second main surface 10b toward the first main surface 10a.

A method of manufacturing the IGBT 200 according to the embodiment 2 is basically expressed by the same flow chart as FIG. 3. The method of manufacturing the IGBT 200 is described hereinafter with reference to FIG. 3.

In a step of forming a front surface element (Step S101), prepared firstly is a wafer of the semiconductor substrate 10 made of n-type silicon doped with phosphorus. At this time, a phosphorus concentration in the semiconductor substrate 10 is lower than a phosphorus concentration for obtaining desired withstand voltage in a completed semiconductor device, thus the semiconductor substrate 10 is in a state of high specific resistance. N-type impurity with which the semiconductor substrate 10 is doped may be arsenic. Then, an element structure of the IGBT 200 is formed on the side of the first main surface 10a of the semiconductor substrate 10. That is to say, the p-type base layer 202 and the n-type emitter layer 203 are formed on the surface portion of the semiconductor substrate 10 on the side of the first main surface 10a. Subsequently, the gate insulating film 206, the gate electrode 207, the interlayer insulating film 208, and the emitter electrode 209 are formed on the first main surface 10a. At this time, the emitter electrode 209 is connected to the n-type emitter layer 203 through the contact hole formed in the interlayer insulating film 208.

In a step of grinding a back surface (Step S102), the second main surface 10b of the semiconductor substrate 10 is ground so that the semiconductor substrate 10 has a desired thickness necessary for retaining withstand voltage. At this time, processing of removing a fracture layer may be performed by chemical etching grinding.

In a step of forming a back surface diffusion layer (Step S103), firstly, phosphorus is implanted into the second main surface 10b of the semiconductor substrate 10, thus the n-type buffer layer 205 is formed on the surface portion of the semiconductor substrate 10 on the side of the second main surface 10b. The p-type collector layer 204 having a higher peak concentration of impurity than the n-type buffer layer 205 is formed in a position smaller in depth than the n-type buffer layer 205 in the surface portion of the semiconductor substrate 10 on the side of the second main surface 10b.

An n-type region of the semiconductor substrate 10 where the p-type base layer 202, the n-type emitter layer 203, the p-type collector layer 204, and the n-type buffer layer 205 are not formed but the n-type region thereof is left in Step S101 and Step S103 serves as the n-type drift layer 201.

In a step of irradiating a light ion (Step S104), as illustrated in FIG. 4, the light ion 20 such as helium (He) is irradiated to pass through the semiconductor substrate 10 from the side of the second main surface 10b of the semiconductor substrate 10 with acceleration energy of 1 MeV or more to generate a damage on a whole region of silicon of the semiconductor substrate 10.

In a step of applying hydrogen plasma treatment and annealing (Step S105), firstly, hydrogen plasma is irradiated from the side of the second main surface 10b of the semiconductor substrate 10 to introduce hydrogen (H) into the region where silicon is damaged. Then, annealing is performed at a temperature of 300° C. to 450° C. in a state where hydrogen is introduced into the damaged region. As a result, the hydrogen-related donor is formed in a whole region in the semiconductor substrate 10, and a dopant concentration profile of the n-type drift layer 201 described above is obtained. That is to say, obtained in a whole region in the n-type drift layer 201 is a dopant concentration profile in which the hydrogen-related donor concentration is always higher than a phosphorus concentration, and the hydrogen-related donor concentration continuously increases from the second main surface 10b toward the first main surface 10a of the semiconductor substrate 10.

In a step of forming a back surface electrode (Step S106), the collector electrode 210 is formed as a back surface electrode necessary for a package sealing on the second main surface 10b of the semiconductor substrate 10.

According to the above steps, a device wafer in which the IGBT 200 having a configuration illustrated in FIG. 5 is formed is completed.

The IGBT 200 in FIG. 5 has a planar gate structure, however, a trench gate structure is also applicable. When the IGBT 200 has the trench gate structure, the gate insulating film 206 and the gate electrode 207 are formed in a trench formed in the first main surface 10a of the semiconductor substrate 10. The p-type base layer 202 and the n-type emitter layer 203 are formed on a sidewall of the trench so that the gate electrode 207 in the trench faces the n-type drift layer 201, the p-type base layer 202, and the n-type emitter layer 203 via the gate insulating film 206, and the trench is formed in a depth so that a bottom portion thereof reaches the n-type drift layer 201 below the p-type base layer 202.

It is also applicable that an n-type drain layer of a first conductivity type having a higher peak concentration of impurity than the n-type drift layer 201 is formed in place of the p-type collector layer 204, thus the semiconductor device according to the embodiment 2 is a metal oxide semiconductor field effect transistor (MOSFET). This MOSFET may also have a trench gate structure.

An n-type collector layer may be partially formed on the surface portion of the semiconductor substrate 10 on the side of the second main surface 10b together with the p-type collector layer 204. That is to say, the p-type collector layer 204 and an n-type collector layer adjacent to the p-type collector layer 204 may be formed between the n-type drift layer 201 and the second main surface 10b.

It is also applicable that an IGBT region and a diode region are provided in the first main surface 10a of the semiconductor substrate 10, and the p-type collector layer 204 is formed on the surface portion of the semiconductor substrate 10 on the side of the second main surface 10b in the IGBT region, and an n-type cathode layer is formed on the surface portion of the semiconductor substrate 10 on the side of the second main surface 10b in the diode region, thus the semiconductor device according to the embodiment 2 is a reverse-conducting (RC) type IGBT. That is to say, the p-type collector layer 204 and an n-type cathode layer adjacent to the p-type collector layer 204 may be formed between the n-type drift layer 201 and the second main surface 10b.

Embodiment 3

Figure 6:
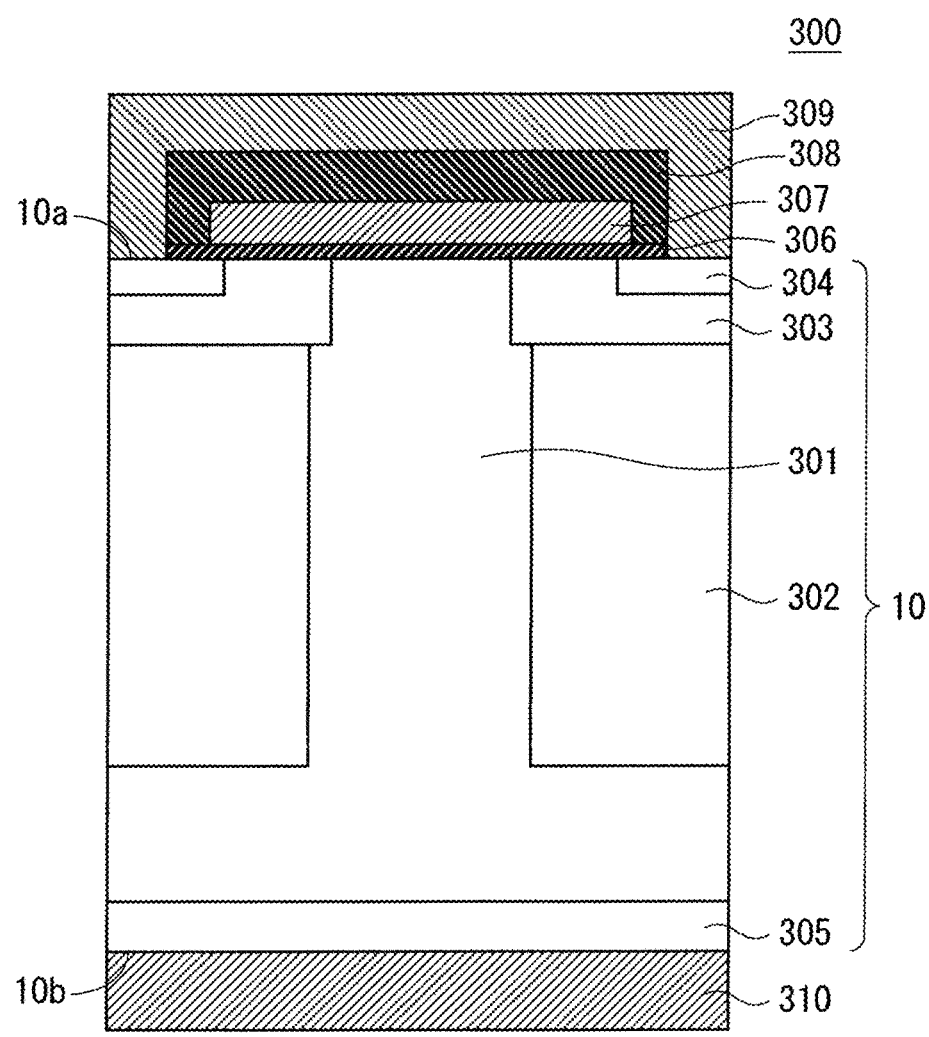
FIG. 6 A cross-sectional view of a semiconductor device (SJ-MOSFET) according to an embodiment 3.

Described in an embodiment 3 is an example that a semiconductor device formed using the semiconductor substrate 10 is a super junction (SJ) type MOS device. FIG. 6 is a cross-sectional view illustrating a configuration of an SJ-MOSFET 300 as a semiconductor device according to the embodiment 3. For simplification, FIG. 6 illustrates only a structure of a unit cell of the MOSFET and illustration of a terminal structure provided in a peripheral region is omitted.

In the embodiment 3, the semiconductor substrate 10 in which the SJ-MOSFET 300 is formed is the CZ epitaxial substrate. However, a type of the semiconductor substrate 10 is not limited thereto, but an MCZ substrate or an FZ substrate, for example, is also applicable.

As illustrated in FIG. 6, an n-type pillar layer 301 (first semiconductor pillar region) of a first conductivity type and a p-type pillar layer 302 (second semiconductor pillar region) of a second conductivity type are formed between the first main surface 10a and the second main surface 10b of the semiconductor substrate 10. The n-type pillar layer 301 and the p-type pillar layer 302 are adjacent to each other, and alternately provided toward a lateral direction (direction horizontal to the first main surface 10a).

A p-type base layer 303 of a second conductivity type is selectively formed in the surface portion of the semiconductor substrate 10 on the side of the first main surface 10a, that is to say, a part of a region between the n-type pillar layer 301 and the first main surface 10a and between the p-type pillar layer 302 and the first main surface 10a. An n-type source layer 304 of a first conductivity type is formed in a part of a region in the surface portion of the p-type base layer 303.

An n-type drain layer 305 of a first conductivity type having a higher peak concentration of impurity than the n-type pillar layer 301 and the p-type pillar layer 302 is formed in the surface portion of the semiconductor substrate 10 on the side of the second main surface 10b, that is to say, between the n-type pillar layer 301 and the second main surface 10b and between the p-type pillar layer 302 and the second main surface 10b.

A gate insulating film 306 is formed on the first main surface 10a of the semiconductor substrate 10 to extend over the n-type pillar layer 301, the p-type base layer 303, and the n-type source layer 304, and a gate electrode 307 is formed thereon. The gate electrode 307 is disposed to face the n-type pillar layer 301, the p-type base layer 303, and the n-type source layer 304 via the gate insulating film 306. An interlayer insulating film 308 is formed on the gate electrode 307, and a source electrode 309 is formed on the interlayer insulating film 308. A contact hole reaching the n-type source layer 304 is formed in the interlayer insulating film 308, and the source electrode 309 is connected to the n-type source layer 304 through the contact hole.

A drain electrode 310 connected to the n-type source layer 304 is formed on the second main surface 10b of the semiconductor substrate 10.

A dopant concentration profile of the semiconductor substrate 10 in the embodiment 3 is described hereinafter.

Figure 7:
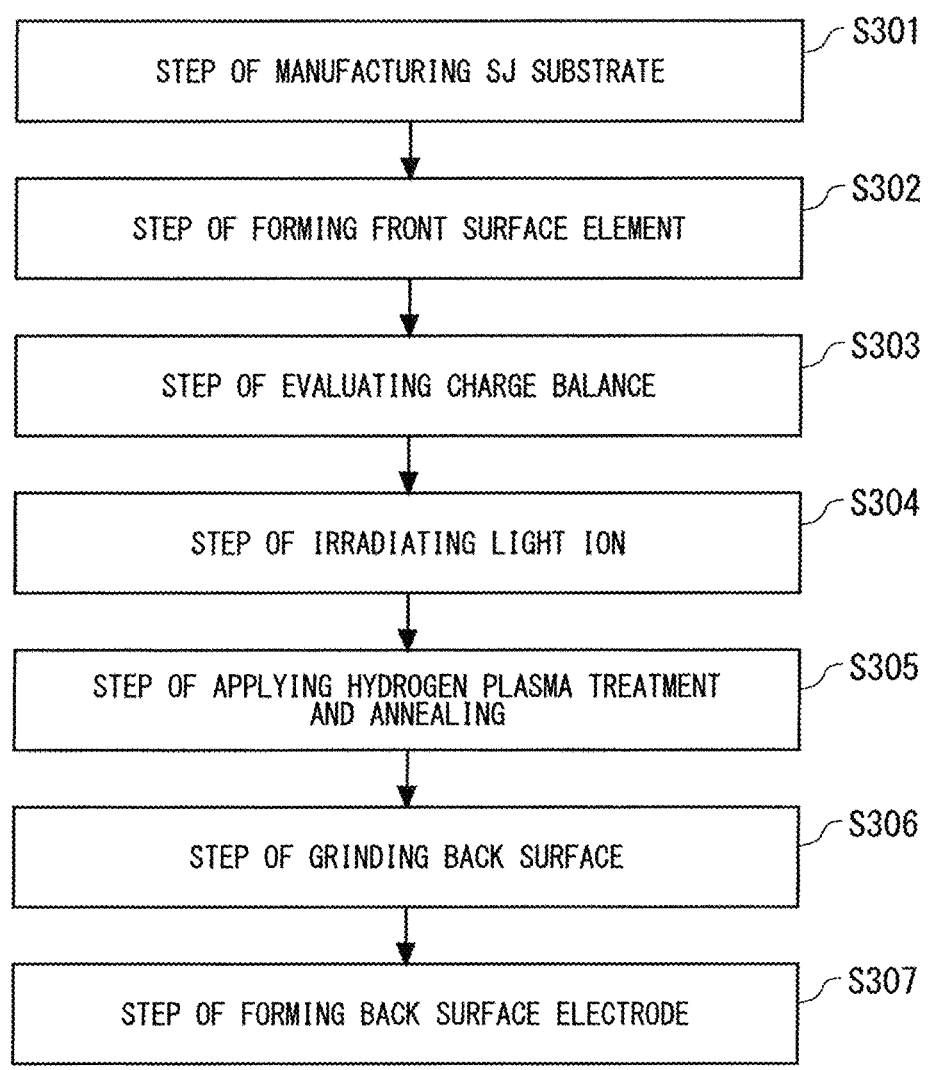
FIG. 7 A flow chart illustrating a process of manufacturing of the semiconductor device according to the embodiment 3.

FIG. 7 is a flow chart illustrating a method of manufacturing the SJ-MOSFET 300 according to the embodiment 3. The method of manufacturing the SJ-MOSFET 300 is described hereinafter with reference to FIG. 7.

Figure 8:
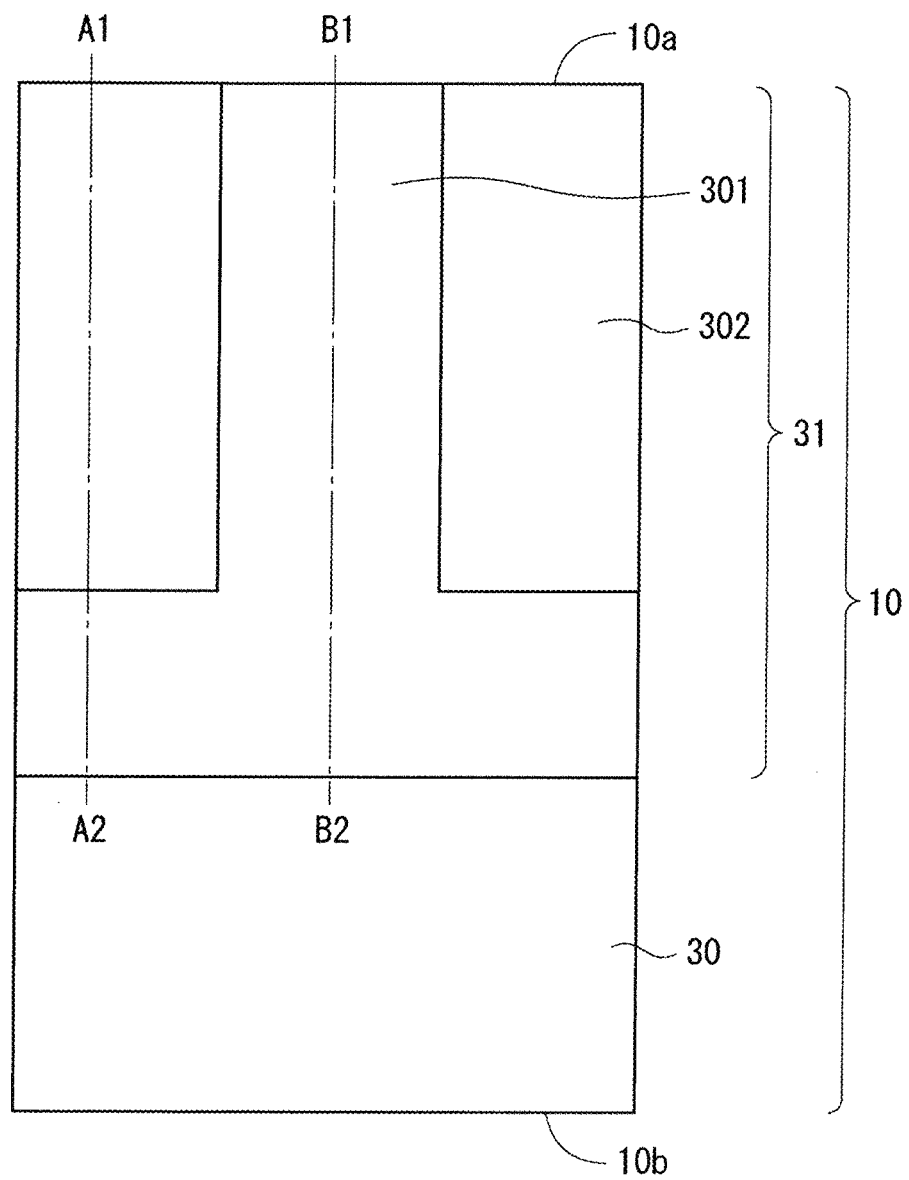
FIG. 8 A cross-sectional view of a semiconductor substrate (SJ substrate) according to the embodiment 3.

In a step of manufacturing the SJ substrate (Step S301), prepared firstly as illustrated in FIG. 8 is the semiconductor substrate 10 as the CZ epitaxial substrate made by growing an n-type epitaxial layer 31 in which a high concentration n-type substrate 30 doped with phosphorus or arsenic at a high concentration is doped with phosphorus. Then, the n-type pillar layer 301 and the p-type pillar layer 302 are formed in the n-type epitaxial layer 31 of the semiconductor substrate 10. At this time, the n-type pillar layer 301 and the p-type pillar layer 302 are adjacent to each other, and are alternately disposed toward the lateral direction. The semiconductor substrate 10 in which the n-type pillar layer 301 and the p-type pillar layer 302 are formed is referred to as "the SJ substrate 10" hereinafter.

An optional method is applicable as a method of manufacturing the SJ substrate 10, and applicable are, for example, a multi-epitaxial manufacturing system of performing an epitaxial growth and an ion implantation several times, thereby forming the n-type pillar layer and the p-type pillar layer and a trench fill system of forming a trench in a silicon layer, and epitaxial growing silicon to fill the trench, thereby forming the n-type pillar layer and the p-type pillar layer.

In a step of forming a front surface element (Step S302), an element structure of the SJ-MOSFET 300 is formed on the side of the first main surface 10a of the semiconductor substrate 10. Firstly, the p-type base layer 303 and the n-type source layer 304 are formed on the surface portion of the SJ substrate 10 on the side of the first main surface 10a. Subsequently, the gate insulating film 306, the gate electrode 307, the interlayer insulating film 308, and the source electrode 309 are formed on the first main surface 10a. At this time, the source electrode 309 is connected to the n-type source layer 304 through the contact hole formed in the interlayer insulating film 308.

In a step of evaluating a charge balance (Step S303), a charge balance of the SJ substrate 10 is evaluated. The evaluation of the charge balance is performed by evaluating element withstand voltage with a wafer test or evaluating a test element group (TEG) for a charge balance monitor. The TEG for the charge balance monitor may be a TEG formed on a monitor substrate different from a manufacture wafer or a TEG provided in an ineffective region on an manufacture wafer or a prescribed TEG area. An insufficient donor concentration and accepter concentration relative to the charge balance is calculated for the n-type pillar layer 301 and the p-type pillar layer 302 using the evaluation of the charge balance.

In a step of irradiating a light ion (Step S304), as illustrated in FIG. 4, the light ion 20 such as helium (He) is irradiated to pass through the semiconductor substrate 10 from the side of the second main surface 10b of the SJ substrate 10 with acceleration energy of 1 MeV or more to generate a damage on a whole region of silicon of the SJ substrate 10 based on a calculation result of the shortage of the donor concentration in Step S303.

In a step of applying hydrogen plasma treatment and annealing (Step S305), firstly, hydrogen plasma is irradiated from the side of the second main surface 10b of the SJ substrate 10 to introduce hydrogen (H) into the region where silicon is damaged. Then, annealing is performed at a temperature of 300° C. to 450° C. in a state where hydrogen is introduced into the damaged region. As a result, the hydrogen-related donor is formed in a whole region in the SJ substrate 10. The hydrogen-related donor concentration is adjusted in this step, thus the charge balance can be corrected to have a desired value after the charge balance of the SJ substrate 10 is evaluated.

In a step of grinding a back surface (Step S306), the high concentration n-type substrate 30 located on the side of the second main surface 10b of the SJ substrate 10 is ground to reduce ON resistance of the SJ-MOSFET 300. At this time, processing of removing a fracture layer may be performed by chemical etching grinding. A portion of the high concentration n-type substrate 30 which is not removed in this step but is left serves as the n-type drain layer 305.

In a step of forming a back surface electrode (Step S307), the drain electrode 310 is formed as a back surface electrode necessary for a package sealing on the second main surface 10b of the SJ substrate 10.

According to the above steps, a device wafer in which the IGBT 200 having a configuration illustrated in FIG. 6 is formed is completed.

Figure 10:
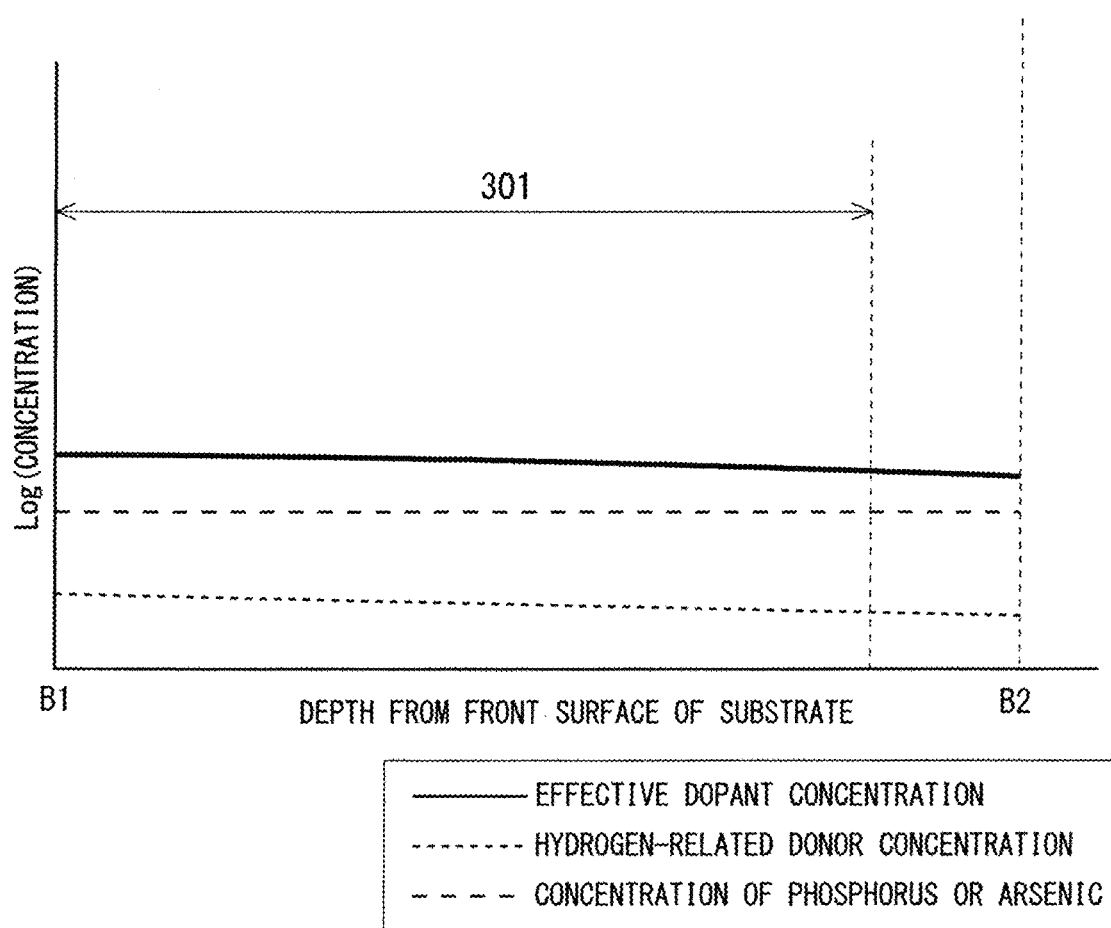
FIG. 10 A diagram illustrating a dopant concentration profile in a depth direction of a portion of an n-pillar layer in the semiconductor substrate according to the embodiment 3.

FIG. 9 illustrates a dopant concentration profile in a depth direction of a portion of the p-type pillar layer 302 in the SJ substrate 10 (FIG. 8) after the processing of Steps S304 and S305 is performed, that is to say, a dopant concentration profile along an A1-A2 line in FIG. 8. FIG. 10 illustrates a dopant concentration profile in a depth direction of a portion of the n-type pillar layer 301 in the SJ substrate 10 after the processing of Steps S304 and S305 is performed, that is to say, a dopant concentration profile along a B1-B2 line in FIG. 8.

As illustrated in FIG. 9, a concentration of the hydrogen-related donor introduced into the p-type pillar layer 302 is always lower than an impurity concentration (a concentration of boron) of the p-type pillar layer 302 in a whole region from the end portion on the side of the first main surface 10a to the end portion on the side of the second main surface 10b, and continuously increases from the second main surface 10b toward the first main surface 10a. That is to say, the hydrogen-related donor concentration of the p-type pillar layer 302 is highest in the end portion of the p-type pillar layer 302 on the side of the first main surface 10a, and is lowest in the end portion of the p-type pillar layer 302 on the side of the second main surface 10b, thus has a gradient that the hydrogen-related donor decreases from the side of the first main surface 10a toward the side of the second main surface 10b. The hydrogen-related donor covers a charge of an acceptor of boron, thus an effective dopant concentration in the depth direction of the p-type pillar layer 302 has a gradient increasing from the side of the first main surface 10a toward the side of the second main surface 10b of the SJ substrate 10.

As illustrated in FIG. 10, a concentration of a hydrogen-related donor introduced into the n-type pillar layer 301 is always lower than an impurity concentration (a concentration of phosphorus or arsenic) of the n-type pillar layer 301 in a whole region from the end portion on the side of the first main surface 10a to the end portion on the side of the second main surface 10b, and continuously increases from the second main surface 10b toward the first main surface 10a. That is to say, the concentration of the hydrogen-related donor of the p-type pillar layer 301 is highest in the end portion of the n-type pillar layer 301 on the side of the first main surface 10a, and is lowest in the end portion of the n-type pillar layer 301 on the side of the second main surface 10b, thus has a gradient that the hydrogen-related donor decreases from the side of the first main surface 10a toward the side of the second main surface 10b. Thus, an effective dopant concentration in the depth direction of the n-type pillar layer 301 has a gradient decreasing from the side of the first main surface 10a toward the side of the second main surface 10b of the SJ substrate 10.

Accordingly, the SJ-MOSFET 300 according to the embodiment 3 has a structure that the side of the first main surface 10a of the SJ substrate 10 has a p-rich structure and gradually has an n-rich structure toward the second main surface 10b of the SJ substrate 10. Accordingly, sensitivity of withstand voltage to a charge imbalance amount increases, and peak withstand voltage can be increased, thus obtained is an effect that higher withstand voltage can be secured.

The SJ-MOSFET 300 in FIG. 6 has a planar gate structure, however, a trench gate structure is also applicable. When the SJ-MOSFET 300 has the trench gate structure, the gate insulating film 306 and the gate electrode 307 are formed in a trench formed in the first main surface 10a of the SJ substrate 10. The p-type base layer 303 and the n-type source layer 304 are formed on a sidewall of the trench so that the gate electrode 307 in the trench faces the n-type pillar layer 301, the p-type base layer 303, and the n-type source layer 304 via the gate insulating film 306, and the trench is formed in a depth so that a bottom portion thereof reaches the n-type pillar layer 301 below the p-type base layer 303.

It is also applicable that a p-type collector layer of a second conductivity type having a higher peak concentration of impurity than the n-type pillar layer 301 and the p-type pillar layer 302 is formed in place of the n-type source layer 304, thus the semiconductor device according to the embodiment 3 is an SJ-IGBT. This SJ-IGBT may also have a trench gate structure.

Embodiment 4

In the embodiment 4, a step of generating a damage in silicon of the semiconductor substrate 10 is performed not by light ion irradiation but by electron beam irradiation to introduce the hydrogen-related donor into a whole region in the wafer. An electron beam has a feature that it has higher transmittivity than a light ion such as He or proton. Thus, a uniform damage can be generated even when the electron beam is irradiated from the second main surface 10b of the wafer in the semiconductor substrate 10 in the manner similar to FIG. 4 or the electron beam is irradiated from the first main surface 10a of the wafer in contrast to FIG. 4. Thus, the hydrogen-related donor introduced into the semiconductor substrate 10 is uniformly introduced in the depth direction of the semiconductor substrate 10.

Figure 11:
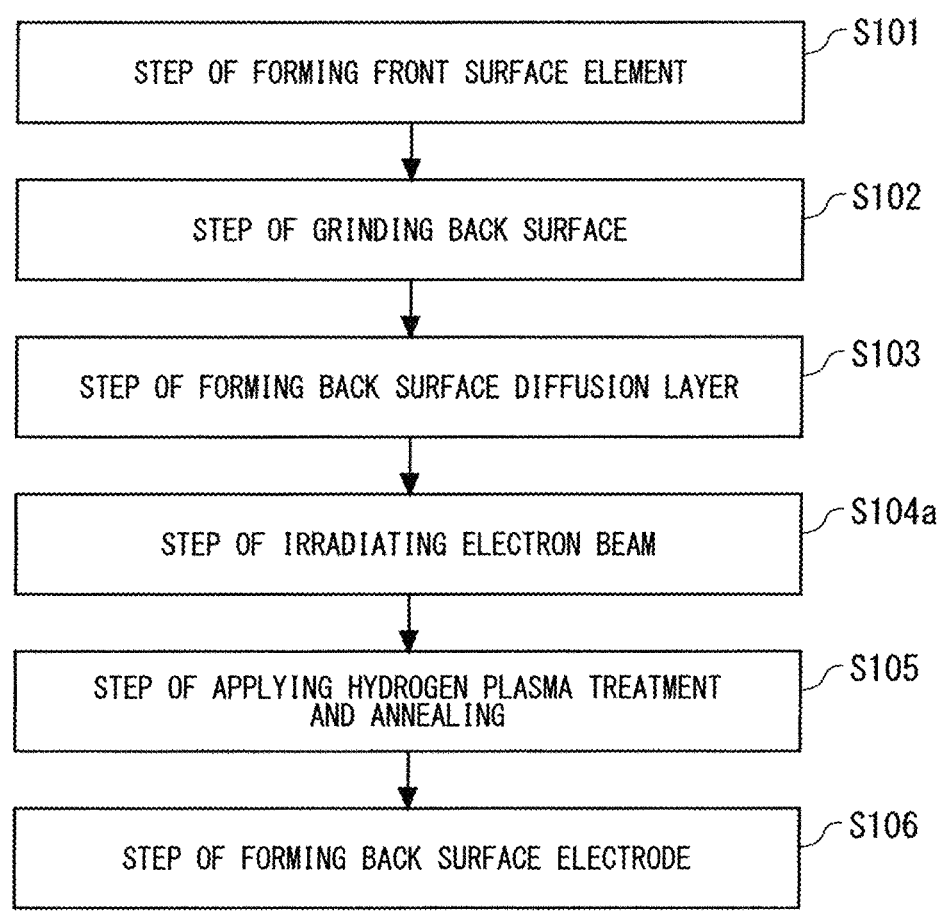
FIG. 11 A flow chart illustrating a process of manufacturing of a semiconductor device according to an embodiment 4.

For example, FIG. 11 is a flow chart of a case where the electron beam irradiation is performed in place of the light ion irradiation in the method of manufacturing the PiN diode 100 according to the embodiment 1. FIG. 11 is similar to FIG. 3 except that the step of irradiating the light ion (Step S104) is replaced with a step of irradiating the electron beam (Step S104a). In Step S104a, the flow in FIG. 11 is basically the same as that in FIG. 3 except that not the light ion irradiation but the electron beam irradiation is performed. However, irradiation energy of the electron beam is preferably within a range from 400 keV to 3 MeV. In Step S104a, the electron beam may be irradiated from the side of the first main surface 10a or the side of the second main surface 10b of the semiconductor substrate 10.

Figure 12:
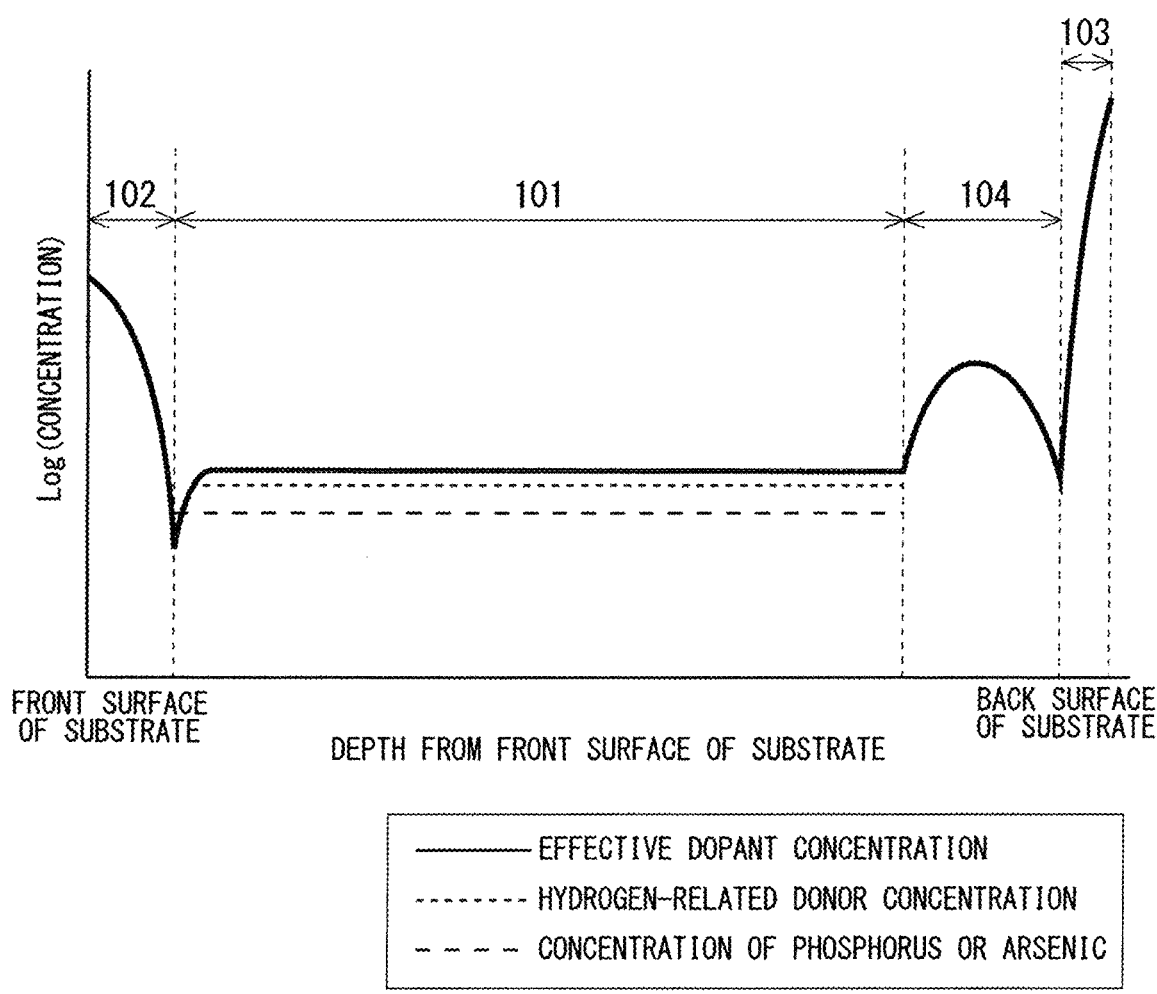
FIG. 12 A diagram illustrating a dopant concentration profile in a depth direction of the semiconductor device (PiN diode) according to the embodiment 4.

FIG. 12 illustrates a dopant concentration profile in the depth direction of the PiN diode 100 manufactured in accordance with the flow in FIG. 11. In the manner similar to FIG. 2, the n-type drift layer 101 includes the hydrogen-related donor over a whole region thereof, and the hydrogen-related donor concentration is always equal to or higher than an impurity concentration (concentration of phosphorus or arsenic) of the n-type drift layer 101 over the whole region of the n-type drift layer 101. However, differing from FIG. 2, the hydrogen-related donor concentration in the depth direction of the semiconductor substrate 10 is uniform over the whole region of the n-type drift layer 101.

Described herein is the example of performing the electron beam irradiation in place of the light ion irradiation in the method of manufacturing the semiconductor device according to the embodiment 1, however, the present embodiment can also be applied to the embodiments 2 and 3.

Each embodiment can be arbitrarily combined, or each embodiment can be appropriately varied or omitted.

The foregoing description is in all aspects illustrative, and is therefore understood that numerous modification examples not illustrated can be devised.

EXPLANATION OF REFERENCE SIGNS 10 semiconductor substrate, 10a first main surface, 10b second main surface, 20 light ion, 30 high concentration n-type substrate, 31 n-type epitaxial layer, 100 PiN diode, 101 n-type drift layer, 102 p-type anode layer, 103 n-type cathode layer, 104 n-type buffer layer. 105 anode electrode, 106 cathode electrode, 200 IGBT, 201 n-type drift layer, 202 p-type base layer, 203 n-type emitter layer, 204 p-type collector layer, 205 n-type buffer layer, 206 gate insulating film, 207 gate electrode, 208 interlayer insulating film, 209 emitter electrode, 210 collector electrode, 300 SJ-MOSFET, 301 n-type pillar layer, 302 p-type pillar layer, 303 p-type base layer, 304 n-type source layer, 305 n-type drain layer, 306 gate insulating film, 307 gate electrode, 308 interlayer insulating film, 309 source electrode, 310 drain electrode.

The invention claimed is:

1. A semiconductor device, comprising:
  a semiconductor substrate having a first main surface and a second main surface;
  a first semiconductor region of a first conductivity type that is a drift layer formed between the first main surface and the second main surface of the semiconductor substrate;
  a second semiconductor region of a second conductivity type formed between the first semiconductor region and the first main surface; and
  at least a third semiconductor region of a first conductivity type formed between the first semiconductor region and the second main surface and having a higher peak concentration of impurity than the first semiconductor region, wherein
  a hydrogen-related donor is included in a whole region ranging from an end portion on a side of the first main surface to an end portion on a side of the second main surface in the first semiconductor region, and
  a concentration of the hydrogen-related donor of the first semiconductor region is higher than an impurity concentration of the first semiconductor region.

2. The semiconductor device according to claim 1, wherein
  the concentration of the hydrogen-related donor of the first semiconductor region continuously increases from the second main surface toward the first main surface.

3. The semiconductor device according to claim 1, wherein
  the semiconductor substrate is an MCZ substrate.

* * * * *